United States Patent
Yi et al.

(10) Patent No.: US 8,802,488 B2
(45) Date of Patent: Aug. 12, 2014

(54) SUBSTRATE DEPOSITING SYSTEM AND DEPOSITING METHOD USING THE SAME

(75) Inventors: Jeong-Ho Yi, Yongin (KR); Suk-Won Jung, Yongin (KR); Seung-Ho Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 456 days.

(21) Appl. No.: 13/179,350

(22) Filed: Jul. 8, 2011

(65) Prior Publication Data
US 2012/0064728 A1 Mar. 15, 2012

(30) Foreign Application Priority Data
Sep. 15, 2010 (KR) .......................... 10-2010-0090597

(51) Int. Cl.
*H01L 51/40* (2006.01)
*C23C 16/00* (2006.01)

(52) U.S. Cl.
USPC ............. 438/99; 438/780; 438/782; 118/719; 118/726; 118/500; 156/345.31; 156/345.32

(58) Field of Classification Search
None
See application file for complete search history.

(56) References Cited

U.S. PATENT DOCUMENTS

| | | | | |
|---|---|---|---|---|
| 5,566,076 A | * | 10/1996 | Kuroda | 700/213 |
| 5,658,123 A | * | 8/1997 | Goff et al. | 414/805 |
| 6,009,890 A | * | 1/2000 | Kaneko et al. | 134/133 |
| 2002/0031420 A1 | * | 3/2002 | Kroeker | 414/217 |
| 2005/0120578 A1 | * | 6/2005 | van der Meulen | 34/92 |
| 2008/0236615 A1 | * | 10/2008 | Mimken et al. | 134/1.3 |
| 2010/0243163 A1 | * | 9/2010 | Ino et al. | 156/345.31 |
| 2011/0094445 A1 | * | 4/2011 | Shimizu et al. | 118/721 |

FOREIGN PATENT DOCUMENTS

| | | |
|---|---|---|
| KR | 10-2005-0049844 | 5/2005 |
| KR | 10-2006-0084729 | 7/2006 |
| KR | 10-0909418 B1 | 7/2009 |
| KR | 10-2010-0023204 | 3/2010 |

* cited by examiner

*Primary Examiner* — Charles Garber
*Assistant Examiner* — Ron Pompey
(74) *Attorney, Agent, or Firm* — Christie, Parker & Hale, LLP

(57) ABSTRACT

A substrate depositing system and a method of using a substrate depositing system. A substrate depositing system includes a load-lock chamber for loading and unloading a substrate, at least one transfer chamber connected to the load-lock chamber and including a substrate transfer device configured to vertically transfer the substrate, and a pair of depositing chambers connected to opposite sides of the at least one transfer chamber and including a depositing source and a pair of substrate fixing devices, the substrate transfer device including a pair of substrate installing members.

7 Claims, 12 Drawing Sheets

SUBSTRATE DEPOSITING SYSTEM AND DEPOSITING METHOD USING THE SAME

CROSS-REFERENCE TO RELATED APPLICATION

This application claims priority to and the benefit of Korean Patent Application No. 10-2010-0090597 filed in the Korean Intellectual Property Office on Sep. 15, 2010, the entire content of which is incorporated herein by reference.

BACKGROUND

1. Field

Aspects of embodiments of the present invention relate to a substrate depositing system and a depositing method.

2. Description of the Related Art

An organic light emitting diode (OLED) display is a flat display device that has a self emissive characteristic and does not require a separate light source so that it can be made lightweight and thin. Particularly, the OLED display exhibits characteristics such as low power consumption, high luminance, and high response speed, and as such, the OLED display receives much attention as a next-generation display device.

In general, the OLED display includes an organic light emitting element that includes an anode, an organic emission layer, and a cathode. Holes and electrons are injected from the anode and the cathode, respectively, to form excitons, and the excitons make a transition to a ground state, thereby causing the organic light emitting diode to emit light.

An organic emission layer is formed with an organic thin film, and a method for forming the organic thin film on the substrate of the OLED display includes a vacuum depositing method and a wet coating method. As a general method to form an organic thin film, the vacuum deposition method is used to form an organic thin film in a vapor deposition apparatus that includes an organic material evaporation source having a crucible by inserting a vapor deposition material in the crucible and depositing the vapor deposition material by heating the crucible to a predetermined temperature.

The above information disclosed in this Background section is only for enhancement of understanding of the background of the described technology, and therefore it may contain information that does not form the prior art that is already known in this country to a person of ordinary skill in the art.

SUMMARY

According to an aspect of embodiments of the present invention, a substrate depositing system reduces sizes of a transfer chamber and a process chamber by vertically transferring a substrate so as to vertically deposit the substrate.

According to another aspect of embodiments of the present invention a substrate depositing method reduces processing time by efficiently transferring a substrate.

According to one exemplary embodiment of the present invention, a substrate deposition system includes: a load-lock chamber for loading and unloading a substrate, at least one transfer chamber connected to the load-lock chamber and including a substrate transfer device configured to vertically transfer the substrate, and a pair of depositing chambers connected to opposite sides of the at least one transfer chamber and including a depositing source and a pair of substrate fixing devices, the substrate transfer device including a pair of substrate installing members.

In one embodiment, the substrate transfer device further includes: a moving member configured to move the pair of substrate installing members between the at least one transfer chamber and at least one of the load-lock chamber and a depositing chamber of the pair of depositing chambers; and a rotating member configured to rotate the pair of substrate installing members.

The substrate installing member may include a substrate tray for receiving the substrate, and a gripper for fixing the substrate to the substrate tray.

The rotating member may be rotatable with respect to a direction vertical to a transfer direction of the substrate.

In one embodiment, the moving member includes a rail, and a substrate installing member of the pair of substrate installing members is on the rail.

The moving member may include at least one transfer arm and a motor connected to the at least one transfer arm.

The moving member may include a plurality of telescopic arms.

The substrate installing members may be arranged symmetrically with respect to the rotating member.

In one embodiment, the substrate fixing devices face each other in a respective depositing chamber of the pair of depositing chambers, and the depositing source is between the substrate fixing devices.

The respective depositing chamber may further includes a guide member configured to transfer and rotate the depositing source in the respective depositing chamber.

According to another embodiment of the present invention, a substrate deposition method includes: installing a pair of first substrates in a pair of substrate installing members of a substrate transfer device and vertically transferring the pair of first substrates to a transfer chamber; rotating the pair of substrate installing members; transferring the pair of first substrates to at least one depositing chamber connected to the transfer chamber and installing the pair of first substrates in at least one first substrate fixing device; installing a pair of second substrates that are installed in at least one second substrate fixing device and have a deposition material deposited thereon in the pair of substrate installing members and transferring the pair of second substrates to the transfer chamber; rotating the pair of substrate installing members; transferring the pair of second substrates from the transfer chamber; and moving a deposition source in a direction parallel to the pair of first substrates and depositing a deposition material on the pair of first substrates.

In one embodiment, the substrate transfer device includes a moving member and a rotating member, rotating the pair of substrate installing members includes utilizing the rotating member, and transferring at least one of the pair of first substrates and the pair of second substrates includes moving the pair of substrate installing members utilizing the moving member.

In one embodiment, the at least one depositing chamber includes a pair of depositing chambers arranged symmetrically with respect to the transfer chamber, and the pair of first substrates are transferred to the pair of depositing chambers arranged symmetrically with respect to the transfer chamber.

In one embodiment, the at least one depositing chamber includes a pair of depositing chambers arranged symmetrically with respect to the transfer chamber, and the pair of first substrates are transferred to one of the pair of depositing chambers.

The at least one first substrate fixing device and the at least one second substrate fixing device may face each other in the at least one depositing chamber, and the depositing source may be between the at least one first substrate fixing device and the at least one second substrate fixing device.

After the deposition material is deposited on the pair of first substrates, the method may further include rotating the depositing source to face the at least one second substrate fixing device.

The method may further include transferring the pair of second substrates to a passage chamber connected to the transfer chamber.

According to an aspect of embodiments of the present invention, a size of a substrate depositing system is reduced by vertically transferring the substrate using a substrate transfer device.

According to another aspect of embodiments of the present invention, a substrate is efficiently transferred, and the processing time for depositing the substrate is reduced to improve productivity of an organic light emitting diode (OLED) display.

BRIEF DESCRIPTION OF THE DRAWINGS

The above and other features and advantages will become more apparent to those of ordinary skill in the art by describing in detail some exemplary embodiments of the present invention with reference to the attached drawings. Moreover, additional aspects and/or advantages of embodiments of the present invention are set forth in the following description and accompanying drawings, or may be obvious in view thereof to those skilled in the art.

DETAILED DESCRIPTION

Figure 1:
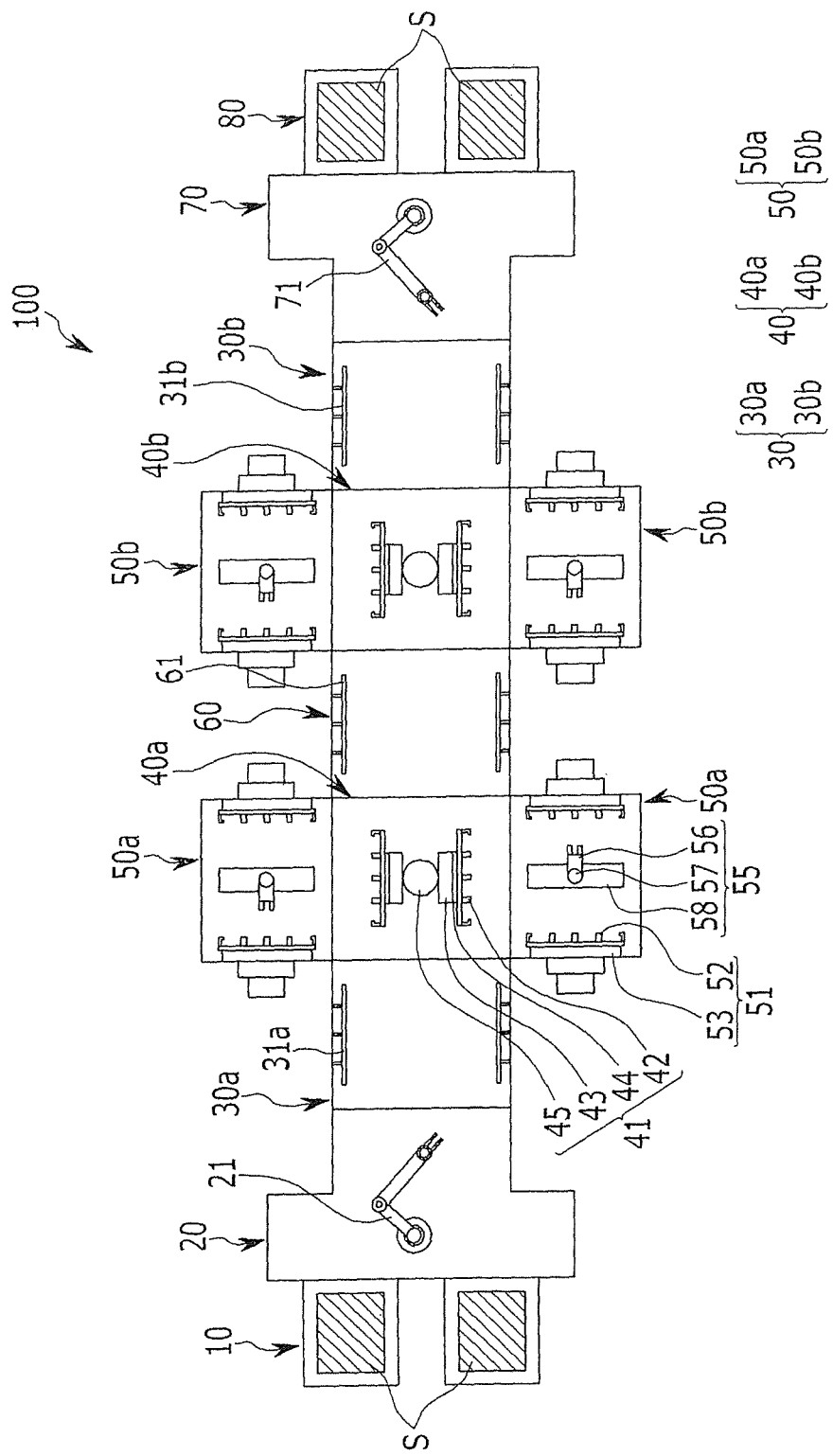
FIG. 1 is a schematic top view of a substrate depositing system according to an exemplary embodiment of the present invention.

Some exemplary embodiments of the present invention will be described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention. Like reference numerals designate like elements throughout the specification and drawings. Sizes and thicknesses of components may be shown exaggerated in the drawings for understanding and ease of description and are not to be construed as limiting embodiments of the present invention thereto.

An organic emission layer is formed with an organic thin film, and a method for forming the organic thin film on the substrate of the OLED display includes a vacuum depositing method and a wet coating method. As a general method to form an organic thin film, the vacuum deposition method is used to form an organic thin film in a vapor deposition apparatus that includes an organic material evaporation source having a crucible by inserting a vapor deposition material in the crucible and depositing the vapor deposition material by heating the crucible to a predetermined temperature.

Depositing systems such as a cluster-type depositing system or an in-line depositing system can be used to form the organic thin film according to the vacuum depositing method, and they include a depositing chamber for depositing a deposition material, such as an organic material, on the substrate, and a transfer chamber for transferring the substrate to the depositing chamber.

The transfer chamber typically includes a substrate transfer means such as a robot arm by which the substrate is horizontally carried into the depositing chamber or is taken out therefrom. Accordingly, the substrate is repeatedly carried in and taken out by the robot arm, thereby wasting a lot of time for the entire process.

Particularly, the deposition can be performed by fixing the substrate vertically in order to prevent the substrate from sinking because of gravity during depositing, and in this case, a process for controlling the substrate that is horizontally input to stand in the vertical direction must be added in the vertical depositing system, and hence a space for this process must be added and the process time is also increased.

Figure 2:
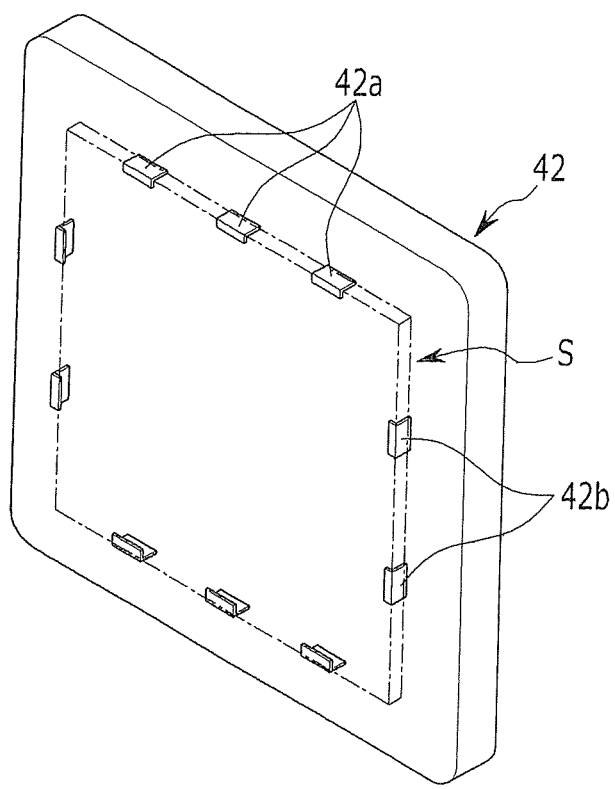
FIG. 2 is a perspective view of a substrate installing member of a substrate depositing system according to an exemplary embodiment of the present invention.

FIG. 1 is a top view of a substrate depositing system according to an exemplary embodiment of the present invention, and FIG. 2 is a perspective view of a substrate installing member of a substrate depositing system according to an exemplary embodiment of the present invention.

Referring to FIG. 1, a substrate depositing system 100 includes a load-lock chamber 30, a transfer chamber 40 connected to the load-lock chamber 30, and a depositing chamber 50 connected to the transfer chamber 40.

The load-lock chamber 30 includes a first load-lock chamber 30a disposed adjacent to a substrate lead-in unit of the substrate depositing system 100 and a second load-lock chamber 30b disposed adjacent to a substrate take-out unit. A substrate carrying-in chamber 20 for carrying a substrate (S) into the first load-lock chamber 30a is disposed to one side of the first load-lock chamber 30a, and a substrate taking-out chamber 70 for taking the substrate (S) out of the second load-lock chamber 30b is disposed to one side of the second load-lock chamber 30b.

The substrate carrying-in chamber 20, in one embodiment, includes a substrate transfer member 21 (e.g., a robot arm) that vertically loads the substrate (S) that is horizontally stored in a cassette 10 into the first load-lock chamber 30a. Also, the substrate taking-out chamber 70 includes a substrate transfer member 71 (e.g., a robot arm) that unloads the substrate (S) vertically arranged in the second load-lock chamber 30b, and horizontally places the same in a cassette 80.

The first load-lock chamber 30a controls the substrate (S) loaded through the substrate carrying-in chamber 20 to stand by before performing the deposition process, and the second load-lock chamber 30b controls the deposited substrate (S) to stand by so as to be unloaded through the substrate taking-out chamber 70. The first load-lock chamber 30a and the second load-lock chamber 30b respectively include a substrate support 31a and a substrate support 31b, and the substrate (S) to be transferred to the transfer chamber 40 or unloaded from the substrate taking-out chamber 70 is vertically attached to the substrate supports 31a and 31b.

During the deposition process, the substrate depositing system 100 maintains a vacuum state. The first load-lock chamber 30a and the second load-lock chamber 30b may include a vacuum pump (not shown). Also, the first load-lock chamber 30a and the second load-lock chamber 30b are blocked or sealed from the substrate carrying-in chamber 20 and substrate taking-out chamber 70 except during the process of loading and unloading the substrate (S).

The transfer chamber 40 connected to the load-lock chamber 30 transfers the substrate (S) to the depositing chamber 50. In the embodiment shown in FIG. 1, the transfer chamber 40 includes a first transfer chamber 40a and a second transfer chamber 40b. However, in embodiments of the present invention, the number of transfer chambers may depend on the depositing process, and it may be determined by the number of organic layers deposited on the substrate (S). For example, in other embodiments, the substrate depositing system may include a single transfer chamber or at least three transfer chambers connected in series, depending, for example, on the deposition process.

The transfer chamber 40 includes a substrate transfer device 41. In one embodiment, the substrate transfer device 41 for transferring the substrate (S) stored in the load-lock chamber 30 or a passage chamber 60 to the depositing chamber 50 includes a pair of substrate installing members, a supporting member for supporting the pair of substrate installing members, a moving member for moving the pair of substrate installing members, and a rotating member for rotating the pair of substrate installing members.

In one exemplary embodiment, the substrate installing member is a transfer tray 42. Referring to FIG. 2, in one embodiment, the transfer tray 42 includes one or more first grippers 42a for fixing the top and the bottom of the substrate (S) and one or more second grippers 42b for fixing the right and left sides of the substrate (S). The substrate (S) is firmly fixed because of such a configuration of the transfer tray 42 when it is received in the transfer tray 42 and is transferred. The first grippers 42a and the second grippers 42b may be formed to be folded or unfolded (i.e. a swing type) when attaching or detaching the substrate (S). The transfer tray 42 according to other embodiments of the present invention is not limited to the described configuration but, rather, may be modified in various ways by a person of ordinary skill in the art.

Referring to FIG. 1 again, a pair of transfer trays 42 are disposed to be supported by a tray supporting member 43 and be symmetrical with respect to a tray rotating member 45. The tray supporting member 43 is fixed to the tray rotating member 45 to control the transfer tray 42 to rotate when the tray rotating member 45 is rotated. The tray rotating member 45 is formed to be rotated about an axis extending in a direction that is vertical to the transfer direction of the substrate (S), and referring to FIG. 1, it is formed to be rotated in the clockwise direction or counterclockwise direction about an axis extending in the direction vertical to the ground (i.e. extending in an upward direction).

A tray moving member 44 is formed between the pair of transfer trays 42 and the corresponding tray supporting member 43. The tray moving member 44 is formed to be fixed to the tray supporting member 43, and moves the transfer tray 42 in a length direction of the transfer tray 42. Operation of the tray moving member 44 for moving the transfer tray 42 will be described further below.

In one embodiment, the depositing chamber 50 includes a pair of depositing chambers 50 arranged on both sides of the transfer chamber 40. In one embodiment, a pair of first depositing chambers 50a and a pair of second depositing chambers 50b are respectively arranged corresponding to the first transfer chamber 40a and the second transfer chamber 40b. However, as described above, the number of depositing chambers may be determined by the depositing process. For example, in other embodiments, a single pair of depositing chambers or at least three pairs of depositing chambers may be included, such as depending on the depositing process.

In the depositing chamber 50, an organic material is deposited on the substrate (S) transferred by the substrate transfer device 41 from the transfer chamber 40. In one embodiment, the depositing chamber 50 includes a substrate fixing device 51 to which the transferred substrate (S) is fixed and a substrate depositing device 55 for spraying the organic material onto the substrate (S).

The substrate fixing device 51, in one embodiment, includes a substrate fixing member 52 to which the substrate (S) that is installed to a substrate installing member such as the transfer tray 42 is fixed and is then transferred, and a supporting member 53 for supporting the substrate fixing member 52 in the depositing chamber 50. In one exemplary embodiment, the substrate fixing member 52 is a tray similar to the transfer tray 42. However, the substrate fixing member 52 is not limited thereto, and in other embodiments of the present invention, the substrate fixing member 52 may have various forms for stably fixing the substrate (S) while depositing the substrate (S).

A shadow mask may be used so as to form a pattern when the organic material is deposited on the substrate (S), and the shadow mask may be fixedly installed in a mask fixing member (not shown) installed before the substrate fixing member 52.

In one embodiment, a pair of substrate fixing devices 51 are formed to face each other in the depositing chamber 50, and a substrate depositing device 55 is disposed between the pair of substrate fixing devices 51.

The substrate depositing device 55, in one embodiment, includes a depositing source 56, a depositing source rotating member 57, and a guide member 58. In one embodiment, the depositing source 56 is a linear depositing source having a plurality of nozzles that are arranged in series. The depositing source 56 is disposed to be parallel with the substrate fixing member 52 so that a plurality of nozzles of the depositing source 56 may be arranged to be vertical to the length direction of the guide member 58. The guide member 58 may be formed with a conveyor belt or a rail to move the depositing source 56, so that the depositing source 56 can move on the guide member 58 with the depositing source rotating member 57.

When the depositing source 56 moves on the guide member 58 and finishes depositing the substrate (S) fixed to the substrate fixing device 51 in the depositing chamber 50, the depositing source rotating member 57 rotates the depositing source 56 to deposit the substrate (S) fixed to the substrate fixing device 51 that is disposed on the opposite side so that the depositing source rotating member 57 to which the depositing source 56 is fixed may be disposed on the guide member 58 and the guide member 58 may go to and return from the depositing source rotating member 57 in one direction. In one embodiment, the depositing source rotating member 57 for rotating the depositing source 56 is formed separate from the guide member 58, and it is possible to directly dispose the depositing source 56 on the guide member and form the guide member 58 with a conveyor belt or a rail movable and rotatable in one direction.

Accordingly, the organic material can be continuously deposited onto a pair of substrates (S) that are transferred into the depositing chamber 50 according to the configuration in which one depositing chamber 50 includes a pair of substrate fixing devices 51 and the substrate depositing device 55.

In one embodiment, the passage chamber 60 is formed between adjacent transfer chambers 40*a* and 40*b*. The passage chamber 60 includes a substrate support 61, and the substrate (S) that is deposited in the first depositing chamber 50*a* is attached to the substrate support 61 through the first transfer chamber 40*a* by the substrate transfer device 41 and is transferred to the second transfer chamber 40*b*. As described, the passage chamber 60 functions as a passage for transmitting the substrate (S) between the first and second transfer chambers 40*a* and 40*b*, and the number of the passage chambers 60 may depend on the deposition process. For example, when the number of deposited organic materials is great and the number of depositing chambers and transfer chambers is increased, a plurality of passage chambers are formed and are disposed between the transfer chambers arranged in series. Alternatively, when a single deposition process is performed, the passage chamber 60 may be omitted.

According to the substrate depositing system 100, since the substrate (S) is transferred in the vertical state by the substrate transfer device 41, the sizes of the chambers can be reduced and the size of the entire system can be resultantly reduced. Also, since a pair of depositing chambers 50 are disposed near one transfer chamber 40 and a pair of substrate fixing devices 51 are formed in each depositing chamber 50, a pair of substrates (S) are simultaneously transferred to the depositing chamber 50 and are simultaneously deposited, thereby reducing the process time.

FIG. 3A to FIG. 3F sequentially show a process for depositing and transferring a substrate in a depositing system according to an exemplary embodiment, and a process for the substrate depositing system 100 to transfer the substrate (S) and deposit the organic material on the substrate (S) will now be described with reference to FIG. 3A to FIG. 3F. When the process for depositing and transferring the substrate is described, the respective substrates are referred to as the first substrate, the second substrate, and the third substrate according to the order of deposition.

Figure 3A:
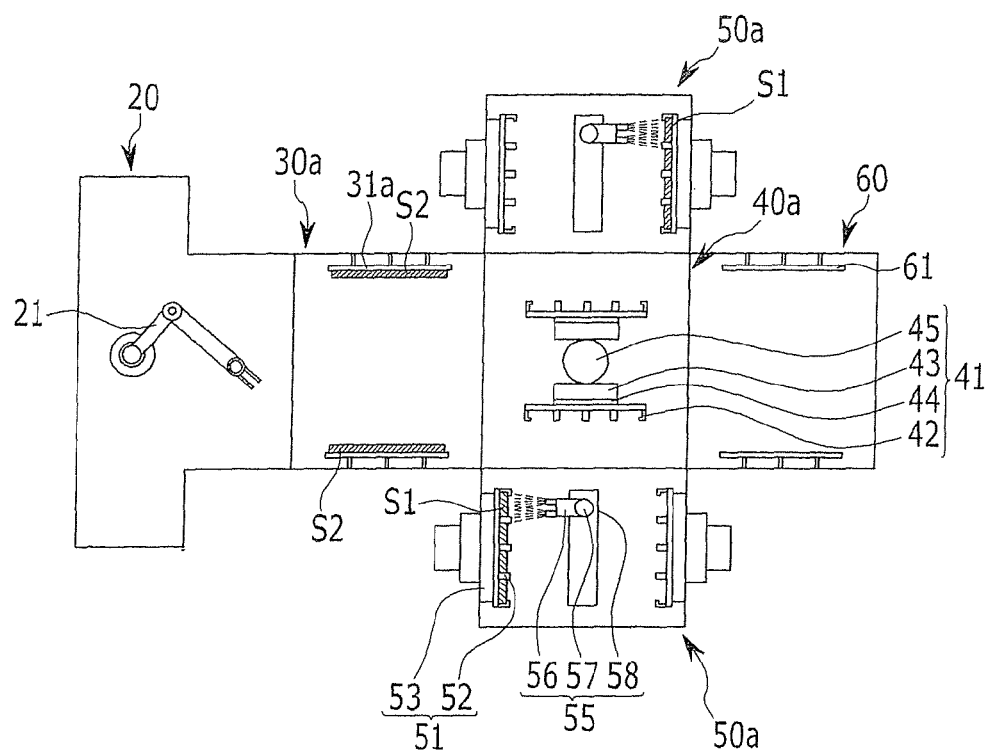
FIGS. 3A to 3F sequentially show a process for depositing and transferring a substrate in a depositing system according to an exemplary embodiment of the present invention.

Referring to FIG. 3A, a second substrate S2 on which the organic material will be deposited is picked up from a cassette by using the substrate transfer member 21 formed with a robot arm and is loaded into the load-lock chamber 30*a*. In one embodiment, the second substrate S2 is stored in the horizontal direction in the cassette and is attached in the vertical direction to the substrate support 31*a* of the load-lock chamber 30*a*. When the second substrate S2 is attached, the load-lock chamber 30*a* is disconnected, or isolated, from the substrate carrying-in chamber 20 and maintains the vacuum state by using a vacuum pump (not shown).

A transferred first substrate S1 is deposited while the vacuum state is maintained in the depositing chamber 50*a*. In one embodiment, a pair of first substrates S1 are fixedly installed in the respective substrate fixing devices 51 in a pair of depositing chambers 50*a* disposed on both sides of the transfer chamber 40*a*, and the depositing process is simultaneously performed in both chambers 50*a*. The deposited first substrates S1 are installed in the substrate fixing devices 51 and positioned at locations diagonal to each other on opposite sides of the transfer chamber 40*a* for increasing the substrate transfer efficiency, which will be described later. In one embodiment, a shadow mask is fixedly installed in a mask fixing member (not shown) before the substrate fixing member 52 to form a pattern when an organic material is deposited on the first substrate S1.

Figure 3B:
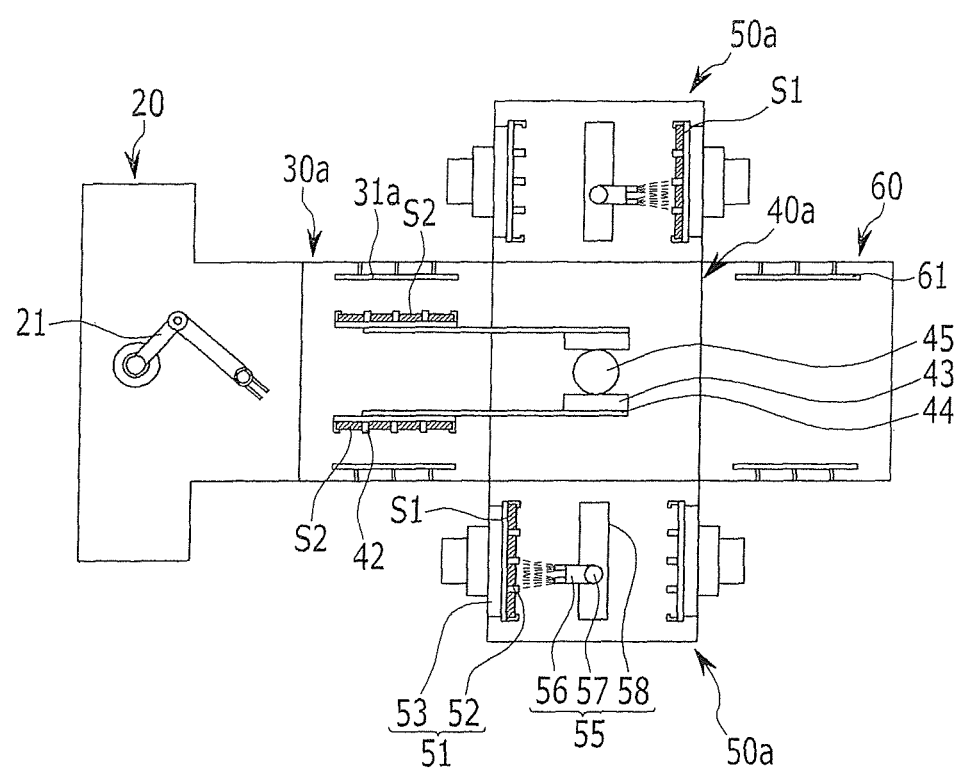

Referring to FIG. 3B, while the depositing sources 56 of the substrate depositing devices 55 move along the guide members 58 and perform the depositing process in the depositing chambers 50*a*, the transfer trays 42 of the substrate transfer device 41 are moved to the load-lock chamber 30*a* by the respective tray moving members 44. As described above, a pair of the transfer trays 42 are disposed to be symmetric with reference to the tray rotating member 45, and the pair of second substrates S2 that are vertically attached to both sides of the load-lock chamber 30*a* are respectively installed in the pair of transfer trays 42. In one embodiment, each of the transfer trays 42 has a gripper on the top, bottom, right, and left sides thereof to stably install the second substrate S2.

Figure 3C:
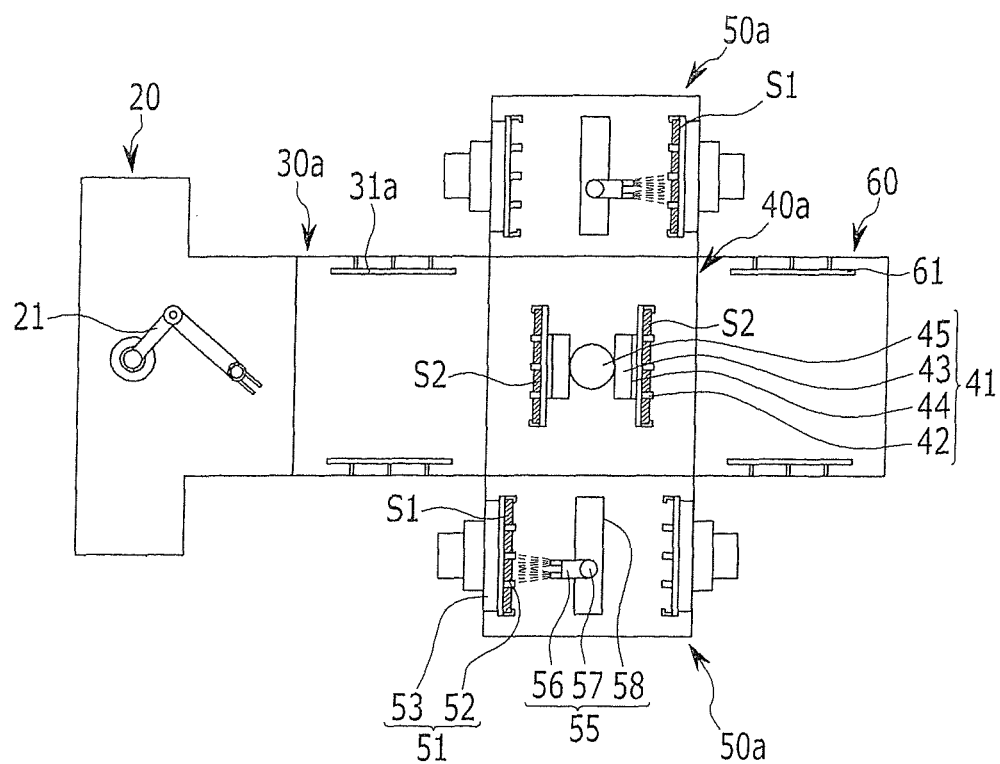

Referring to FIG. 3C, while the first substrates S1 are being deposited in the respective depositing chambers 50*a*, the transfer trays 42 in which the second substrates S2 are installed are moved to the transfer chamber 40*a* by the respective tray moving members 44. To rotate the transfer trays 42 connected to the tray rotating member 45 through the respective tray supporting members 43 by 90 degrees, the tray rotating member 45 is rotated by 90 degrees. Accordingly, by rotating the transfer trays 42 by 90 degrees, the transfer trays 42 initially facing the respective depositing chambers 50*a* are rotated to face the load-lock chamber 30*a* and the passage chamber 60, respectively.

Figure 3D:
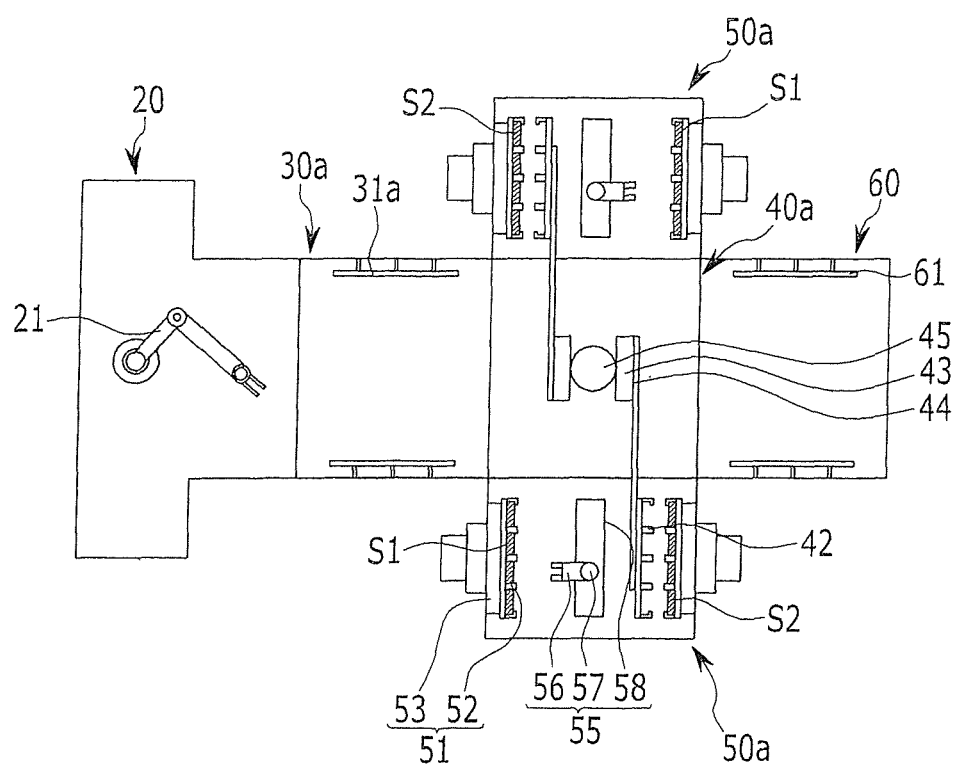

Referring to FIG. 3D, when the first substrates S1 are finished with the depositing process in the depositing chambers 50*a*, the transfer trays 42 are moved to the depositing chambers 50*a* by the tray moving members 44. The tray moving members 44 move the pair of transfer trays 42 to the respective depositing chambers 50*a*, and in order to move the pair of transfer trays 42 simultaneously, in one embodiment, the tray moving members 44 move to locations in the depositing chambers 50*a* that are diagonal to each other with respect to the transfer chamber 40*a*. The transfer trays 42 having moved to the depositing chambers 50*a* by the tray moving members 44 move the second substrates S2 to be deposited to the respective substrate fixing members 52 of the substrate fixing devices 51 in which the first substrates S1 are not installed and then install the second substrates S2 therein.

The depositing sources 56 having deposited the first substrate S1 are rotated by 180 degrees to face the substrate fixing devices 51 in which the second substrates S2 are installed (see FIG. 3E) by the depositing source rotating members 57.

Figure 3E:
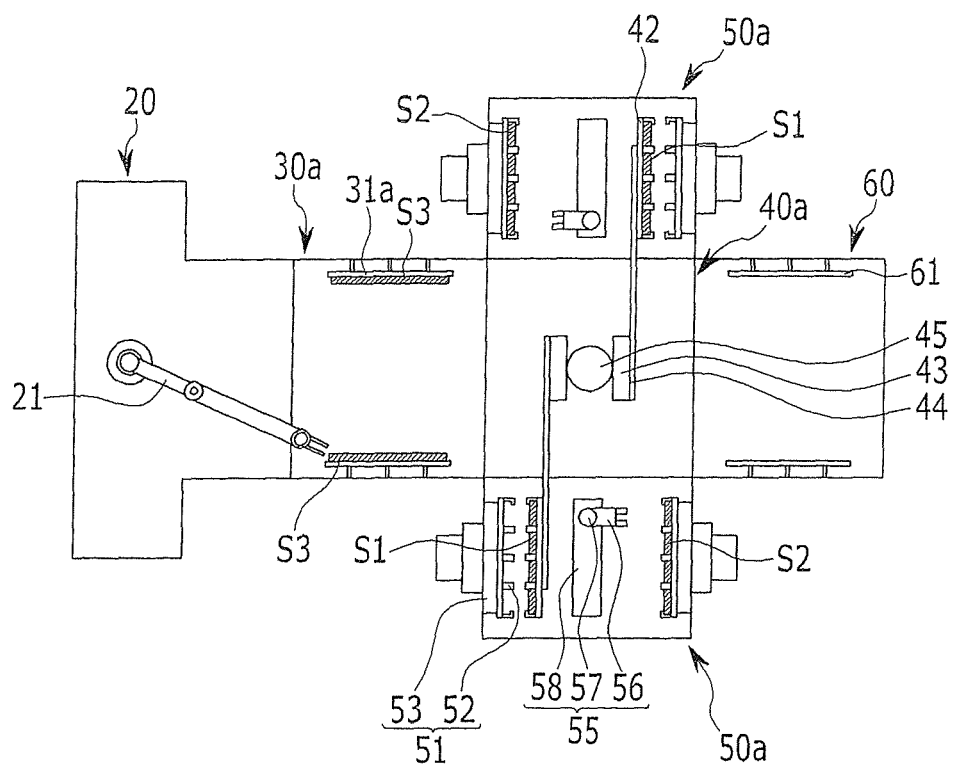

Referring to FIG. 3E, the pair of transfer trays 42 having transferred the second substrates S2 to the substrate fixing devices 51 are moved to the depositing chambers 50*a* on the opposite sides by the tray moving member 44. The transfer trays 42 are moved in front of the substrate fixing devices 51 in which the deposited first substrates S1 are installed, and install the first substrates S1. The depositing process is not performed while the substrates S1 and S2 are carried in and taken out, and in one exemplary embodiment, the substrates S1 and S2 are quickly carried in and taken out by the pair of substrate transfer devices 41 to reduce the waiting time of the depositing source 56.

While the substrates S1 and S2 are carried in and taken out between the transfer chamber 40*a* and the depositing chambers 50*a*, a pair of third substrates S3 are loaded into the load-lock chamber 30*a* by the substrate transfer member 21. The third substrates S3 are vertically attached to the substrate supports 31*a* of the load-lock chamber 30*a*, are transferred to the transfer chamber 40a by the substrate transfer device 41 while the second substrates S2 are deposited, and are input to the respective depositing chambers 50a when the second substrates S2 are finished with deposition.

Figure 3F:
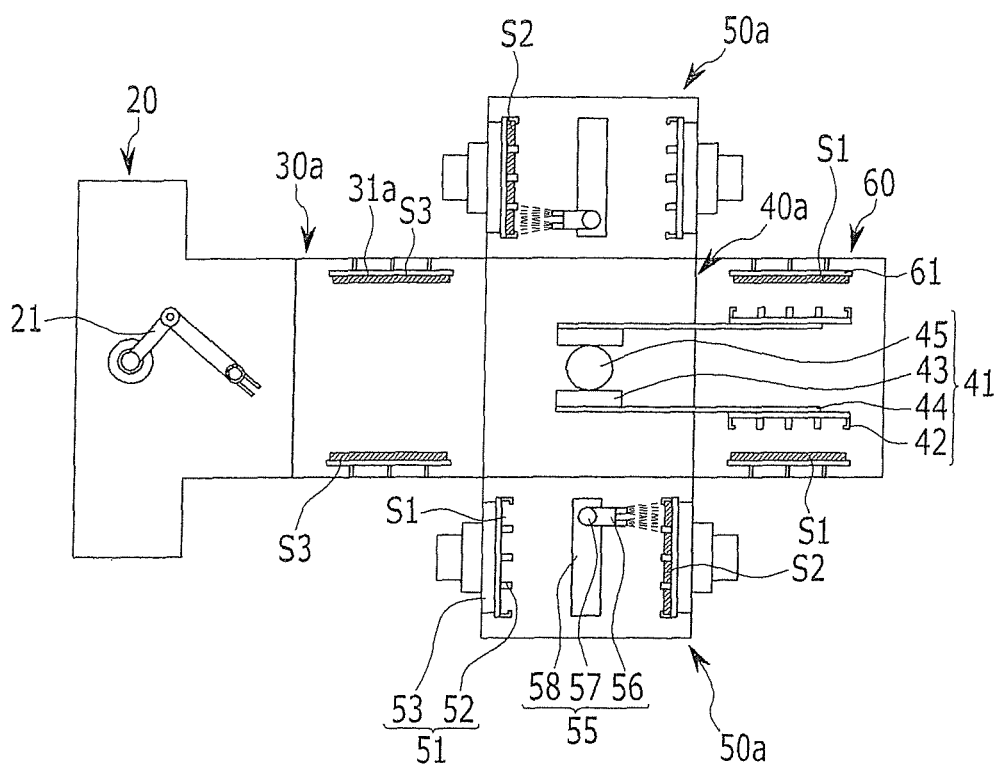

Referring to FIG. 3F, the tray rotating member 45 of the substrate transfer device 41 is rotated by 90 degrees to rotate the transfer trays 42 by 90 degrees. The transfer trays 42 are moved to the passage chamber 60 by the tray moving members 44 to attach the first substrates S1 installed in the transfer trays 42 to the respective substrate supports 61 of the passage chamber 60. While moving the first substrates S1 to the passage chamber 60 and attaching the first substrates S1 therein, the first substrates S1 are maintained in a vertical state to improve transfer efficiency, such as when the first substrates S1 are transferred to the next transfer chamber for an additional depositing process.

In one embodiment, the second substrates S2 start to be deposited in the depositing chambers 50a, and the transfer trays 42 move to the load-lock chamber 30a to install the third substrates S3 that are vertically provided and in the standby state, thereby repeating the same process as described above with respect to the second substrates S2.

When the substrate is deposited by using the substrate depositing system 100, a pair of substrates (S) can be simultaneously deposited in the depositing chambers 50a, a pair of substrates (S) can be simultaneously input into the depositing chambers 50a, and a pair of deposited substrates(S) can also be simultaneously taken out of the same, thereby improving depositing efficiency and transfer efficiency of the substrates. Further, since the substrates are vertically loaded into the substrate depositing system 100 and are vertically transferred, a process for horizontally loading and transferring the substrate and vertically standing the substrate up is not needed, thereby reducing a size of the chamber and decreasing a processing time.

Figure 4:
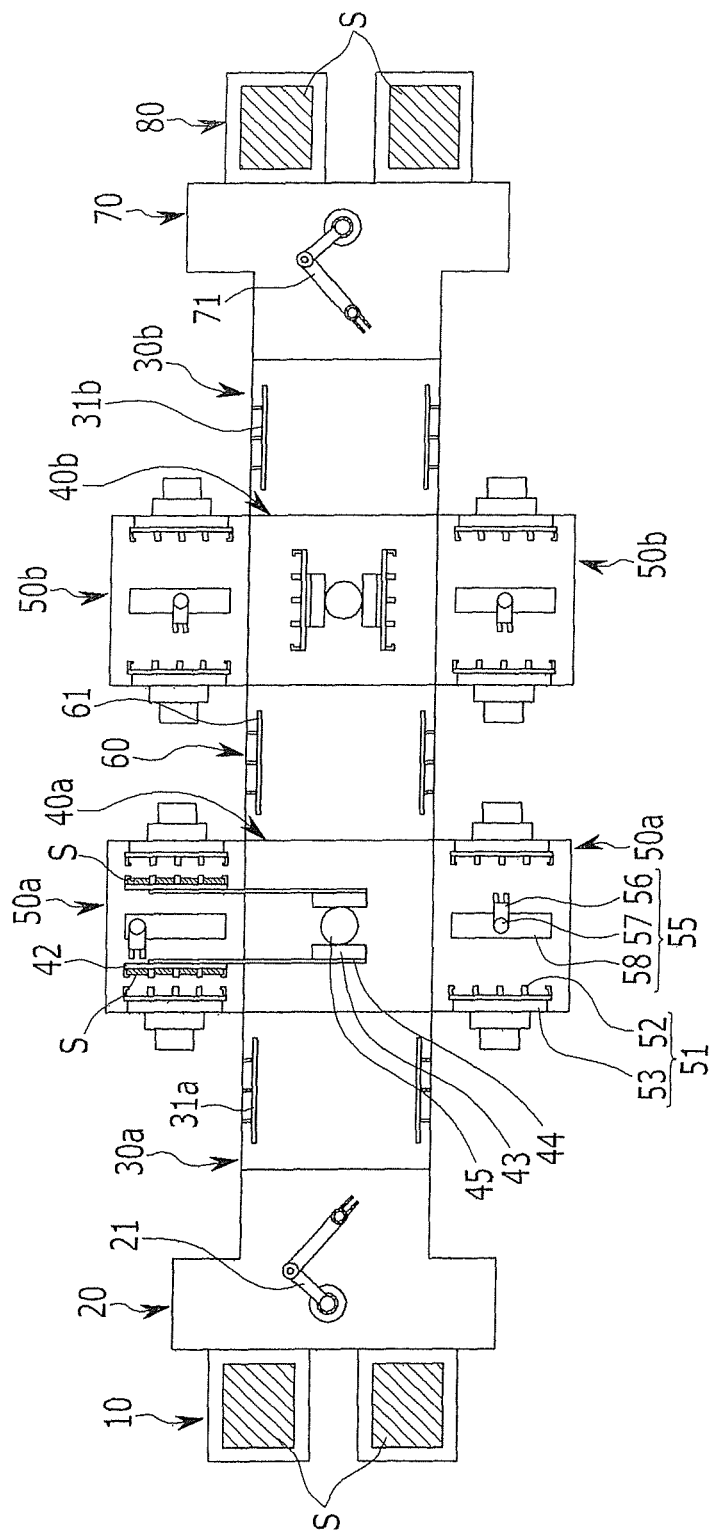
FIG. 4 shows a state of transferring a substrate in a depositing system according to another exemplary embodiment of the present invention.

FIG. 4 shows a state of transferring a substrate according to another manner in a depositing system according to an exemplary embodiment of the present invention.

Referring to FIG. 4, a pair of substrates (S) are installed in a pair of transfer trays 42 and are simultaneously transferable to one of a pair of depositing chambers 50a disposed to both sides of the transfer chamber 40a. When the substrates (S) are transferred in this manner, the time for inputting the substrate (S) and finishing the deposition is increased, but when another one of the pair of depositing chambers 50a is inoperable, it is possible to replace the inoperable depositing chamber 50a without stopping the entire substrate depositing system 100.

When the substrate depositing system 100 is utilized according to an exemplary embodiment of the present invention, the transfer direction of the substrate (S) by a pair of substrate transfer devices 41 is appropriately controlled so the deposition process is continuously performed without stopping the process and the process efficiency is improved.

Some exemplary embodiments of the substrate transfer device in a depositing system according to embodiments of the present invention will now be described. Some similar configurations or variations of the exemplary embodiments will be briefly described.

Figure 5:
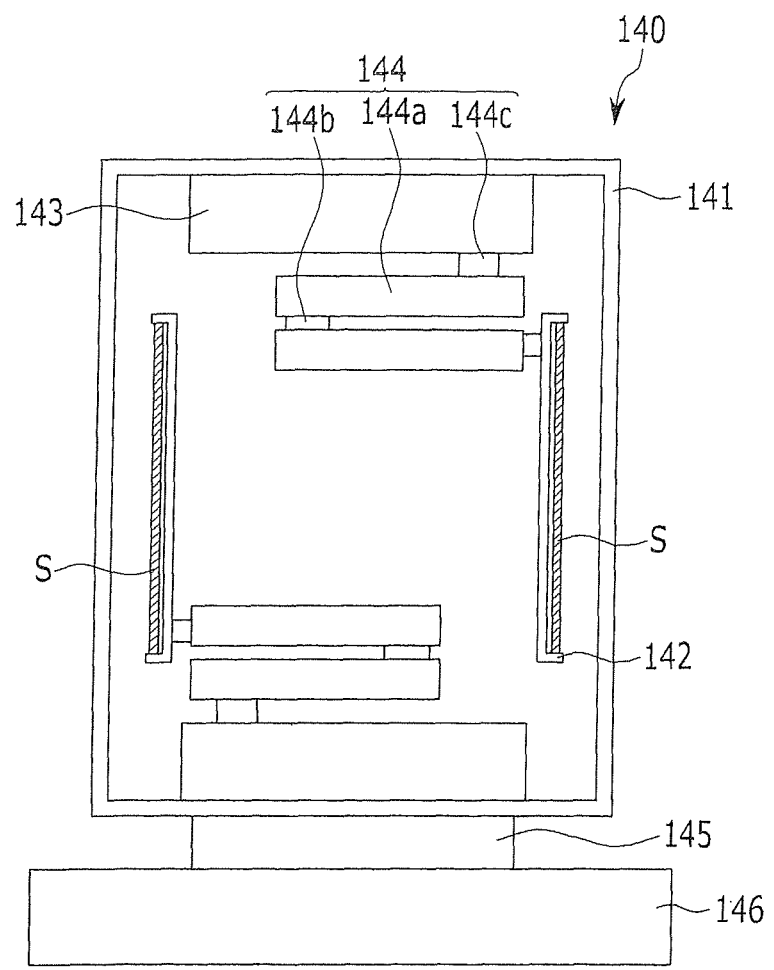
FIG. 5 is a schematic diagram of a substrate transfer device according to another exemplary embodiment of the present invention.

FIG. 5 is a schematic diagram of a substrate transfer device according to one exemplary embodiment.

Referring to FIG. 5, a substrate transfer device 140 according to one exemplary embodiment includes a substrate installing member 142, a supporting member 143, and a transfer member 144. The substrate (S) may be vertically installed by using the substrate installing member 142, and the substrate installing member 142 is connected to the transfer member 144 to be moved to one direction (e.g., in the direction vertical to the ground in FIG. 5).

In one embodiment, the transfer member 144 is formed in the scara arm form. That is, the transfer member 144 includes a plurality of transfer arms 144a and a link 144b for connecting them which are connected to a motor (not shown) formed in the supporting member 143 by a connector 144c. Accordingly, the transfer arm 144a is movable in one direction by controlling the motor, and the substrate is transferable from the load-lock chamber to the transfer chamber and is carried into or taken out of the depositing chamber.

A pair of substrate transfer devices 140 are symmetrically disposed at the top and bottom of a frame 141 so that each transfer member 144 may move in the same direction. In one embodiment, the height of the substrate installing members 142 is formed to be the same.

A rotating member 145 and a supporting member 146 for supporting the rotating member 145 are installed in the frame 141. According to the above-described configuration, the substrate (S) is installed in the substrate transfer device 140 in the load-lock chamber and is transferred to the transfer chamber, and when the rotating member 145 is rotated, the substrate transfer device 140 in which the substrate (S) is installed is rotated to carry the substrate (S) into the depositing chamber or take the substrate (S) out of the depositing chamber.

In the described exemplary embodiment, a pair of substrates (S) may be simultaneously carried into or taken out of the depositing chamber to improve processing efficiency, and the substrate (S) is vertically transferred to reduce the size of the substrate depositing system.

Figure 6:
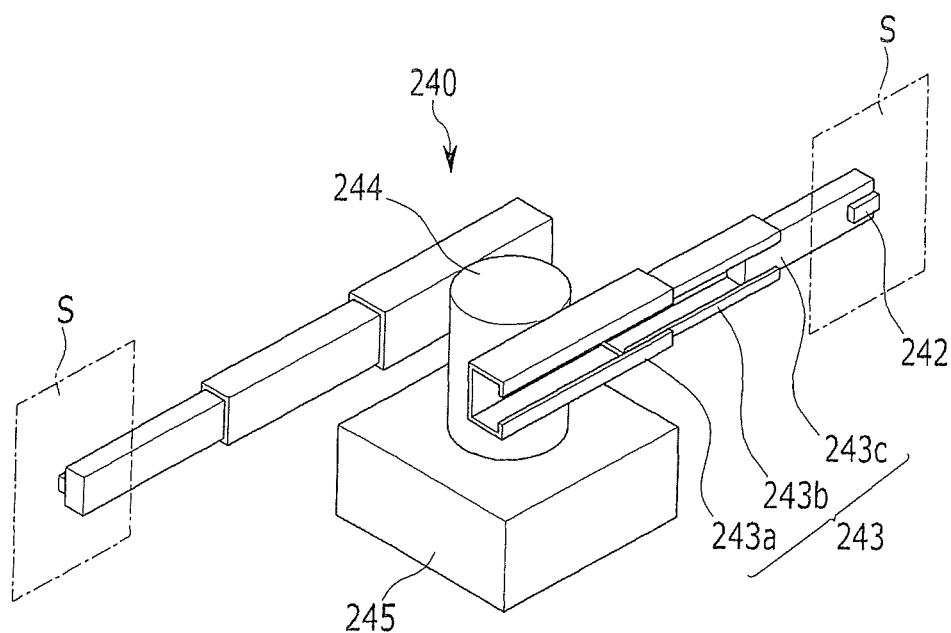
FIG. 6 is a schematic diagram of a substrate transfer device according to another exemplary embodiment of the present invention.

FIG. 6 is a schematic diagram of a substrate transfer device 240 according to another exemplary embodiment of the present invention, and the substrate transfer device 240 includes a substrate installing member 242, a transfer member 243, and a rotating member 244.

The transfer member 243 includes a plurality of telescopic arms. In one embodiment, the transfer member 243 includes a first transfer member 243a, a second transfer member 243b slidable in the first transfer member 243a, and a third transfer member 243c slidable in the second transfer member 243b, and the transfer member 243 is extendable in one direction. The transfer member 243, in one embodiment, has three stages, as shown in FIG. 6. However, in other embodiments, the configuration of the transfer member 243 is variable depending on the deposition and transfer process.

The substrate installing member 242, in one embodiment, is installed on the third transfer member 243c to attach the substrate (S) thereto. The substrate installing member 242 is formed to attach the substrate (S) through a part contacting the substrate (S), and the substrate installing member 242 is formed to stably install the substrate (S) and transfer it, and a tray for receiving the substrate (S) may be formed.

In one embodiment, a pair of transfer members 243 are symmetrically disposed with respect to the rotating member 244. The first transfer member 243a is fixed to the rotating member 244 and is rotated together when the rotating member 244 is rotated, and the rotating member 244 is supported by a supporting member 245.

According to the above-described configuration, in the load-lock chamber, the substrate (S) is installed in the substrate transfer device 240 and is transferred to the transfer chamber, and when the rotating member 244 is rotated, the substrate transfer device 240 on which the substrate (S) is installed is rotated to carry the substrate (S) into or out from the depositing chamber.

Figure 7:
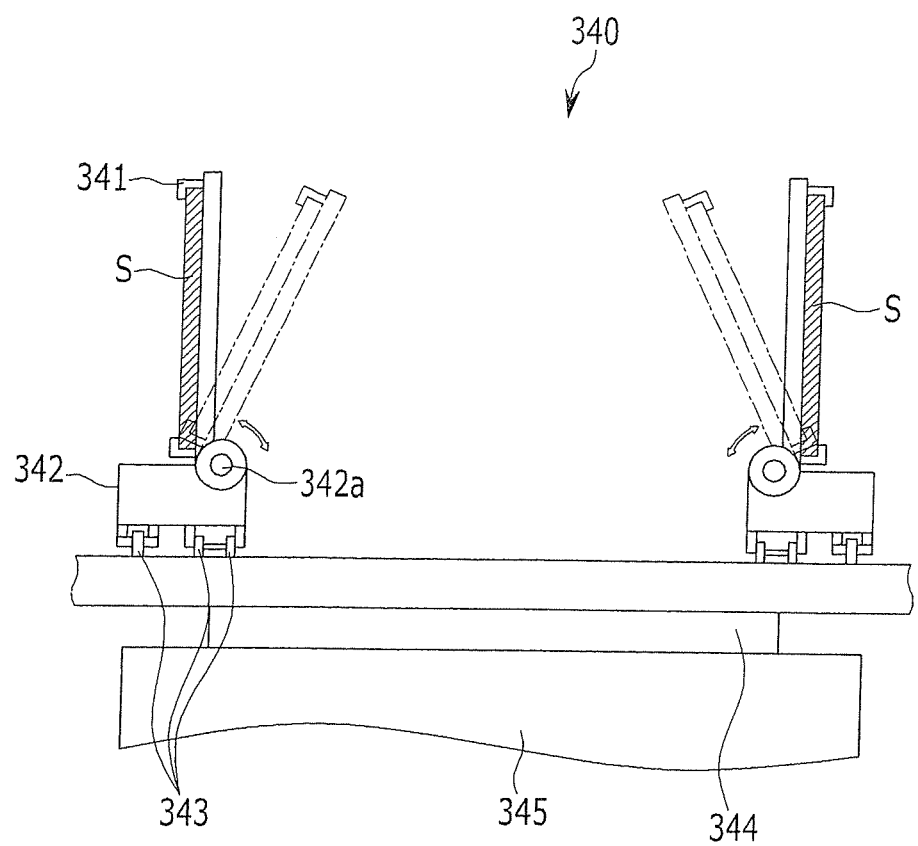
FIG. 7 is a schematic diagram of a substrate transfer device according to another exemplary embodiment of the present invention.

FIG. 7 is a schematic diagram of a substrate transfer device 340 according to another exemplary embodiment, and the substrate transfer device 340 includes a substrate installing member 341, a transfer member 343, and a rotating member 344.

The substrate installing member 341, in one embodiment, is formed to be a tray for receiving the substrate (S), and is supported by a tray support 342. A tray rotator 342a for rotating the substrate installing member 341 from the horizontal direction to the vertical direction is installed in the tray support 342. Therefore, when the substrate (S) is loaded in the horizontal direction, the substrate (S) can be installed by rotating the substrate installing member 341 about a horizontal axis.

The substrate transfer member 343, in one embodiment, is formed to be a rail, and the tray support 342 is disposed on the substrate transfer member 343 to move the substrate installing member 341 in one direction.

The rotating member 344 and a supporting member 345 for supporting the rotating member 344 are installed on one side of the substrate installing member 341 and the transfer member 343. Accordingly, the substrate installing member 341 and the transfer member 343 are rotated when the rotating member 344 is rotated.

According to the above-described configuration, in the load-lock chamber, the substrate (S) is installed in the substrate transfer device 340 and is transferred to the transfer chamber, and when the rotating member 344 is rotated, the substrate transfer device 340 in which the substrate (S) is installed is rotated to carry the substrate (S) into the depositing chamber or take the substrate out from the depositing chamber.

While this invention has been described in connection with some exemplary embodiments, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A substrate deposition method comprising:
    installing a pair of first substrates in a pair of substrate installing members of a substrate transfer device and vertically transferring the pair of first substrates to a transfer chamber;
    rotating the pair of substrate installing members;
    transferring the pair of first substrates to at least one depositing chamber connected to the transfer chamber and installing the pair of first substrates in at least one first substrate fixing device;
    installing a pair of second substrates that are installed in at least one second substrate fixing device and have a deposition material deposited thereon in the pair of substrate installing members and transferring the pair of second substrates to the transfer chamber;
    rotating the pair of substrate installing members;
    transferring the pair of second substrates from the transfer chamber; and
    moving a depositing source in a direction parallel to the pair of first substrates and depositing a deposition material on the pair of first substrates.

2. The substrate deposition method of claim 1, wherein:
    the substrate transfer device includes a moving member and a rotating member,
    rotating the pair of substrate installing members comprises utilizing the rotating member, and
    transferring at least one of the pair of first substrates and the pair of second substrates comprises moving the pair of substrate installing members utilizing the moving member.

3. The substrate deposition method of claim 1, wherein
    the at least one depositing chamber comprises a pair of depositing chambers arranged symmetrically with respect to the transfer chamber, and
    the pair of first substrates are transferred to the pair of depositing chambers arranged symmetrically with respect to the transfer chamber.

4. The substrate deposition method of claim 1, wherein
    the at least one depositing chamber comprises a pair of depositing chambers arranged symmetrically with respect to the transfer chamber, and
    the pair of first substrates are transferred to one of the pair of depositing chambers.

5. The substrate deposition method of claim 1, wherein the at least one first substrate fixing device and the at least one second substrate fixing device face each other in the at least one depositing chamber, and the depositing source is between the at least one first substrate fixing device and the at least one second substrate fixing device.

6. The substrate deposition method of claim 5, wherein, after the deposition material is deposited on the pair of first substrates, the method further comprises rotating the depositing source to face the at least one second substrate fixing device.

7. The substrate deposition method of claim 1, further comprising transferring the pair of second substrates to a passage chamber connected to the transfer chamber.

* * * * *